(12) United States Patent
Ishikawa et al.

(10) Patent No.: US 6,280,308 B1
(45) Date of Patent: Aug. 28, 2001

(54) WAFER SUCTION PAD

(75) Inventors: Toshihiko Ishikawa; Yasushi Katagiri, both of Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 09/613,240

(22) Filed: Jul. 10, 2000

(30) Foreign Application Priority Data

Jul. 9, 1999 (JP) .................................................. 11-195942

(51) Int. Cl.⁷ ...................................................... B24B 27/00
(52) U.S. Cl. ............................................ 451/388; 451/289
(58) Field of Search .............................. 451/41, 287, 285, 451/288, 289, 397, 398, 388, 364

(56) References Cited

U.S. PATENT DOCUMENTS

| | | | |
|---|---|---|---|
| 4,448,404 | * 5/1984 | Ogawa et al. | 269/21 |
| 4,667,944 | * 5/1987 | Althouse | 269/21 |
| 5,324,012 | * 6/1994 | Aoyama et al. | 269/21 |
| 5,888,127 | * 3/1999 | Piper et al. | 451/289 |

FOREIGN PATENT DOCUMENTS

| | | |
|---|---|---|
| 61-182738 | 8/1986 | (JP) . |
| 2-46331 | 10/1990 | (JP) . |
| 8-1464 | 1/1996 | (JP) . |

\* cited by examiner

*Primary Examiner*—Derris H. Banks
(74) *Attorney, Agent, or Firm*—Nixon Peabody LLP; David S. Safran

(57) ABSTRACT

A round groove is formed at the center of a wafer sucking face of a wafer suction pad. A plurality of annular grooves are formed on the wafer sucking face concentrically with the round groove. Each of the grooves is connected with an air intake line. Each of the air intake lines is connected with an air sucking device via a valve. Intake of the air is controlled by opening and closing of each of the valves. When holding the wafer by suction, the air is sucked only from the groove or grooves located inside the outer diameter of the held wafer. Therefore, the entire face of each of wafers of various sizes can be appropriately held by one wafer suction pad.

7 Claims, 4 Drawing Sheets

WAFER SUCTION PAD

BACKGROUND OF THE INVENTION

1. Field of the Invention

The present invention relates generally to a wafer suction pad, specifically a wafer suction pad for holding an extremely thin wafer by suction to transport it.

2. Description of Related Art

In a chamfering machine, which handles a wafer immediately after being sliced from an ingot, the wafer can be held by certain points by suction with a suction pad and transported, because the wafer is very thick.

The necessity has arisen to use the wafer for an IC card, and a planarization apparatus such as a back grinder, which grinds the reverse (opposite to the obverse, on which electronic devices are formed) of the wafer so as to make the wafer thin, processes the wafer as extremely thin as 30 $\mu$m like paper. If the extremely thin wafer is held at certain points by suction in the planarization apparatus, then cracks and chips are usually generated.

In consideration of the above disadvantage, the wafer is held and transported by suction with a suction pad whose sucking face is substantially the same as the size of the wafer in the planarization apparatus of that type.

Yet, in the conventional suction pad, the suction pad must be changed every time the size of the wafer to be processed changes; hence, the working efficiency is lowered.

Japanese Patent Publication No. 2-46331 and Japanese Patent Application Laid-open No. 8-1464 disclose a worktable to hold a wafer in process by suction. In the worktable, annular grooves are formed on a face to suck the wafer, and a suction area of the air can be selected in accordance with the outer diameter of the wafer to be held. However, neither of them discloses applying the grooves to the suction pad that is provided with an arm for transportation.

SUMMARY OF THE INVENTION

The present invention has been developed in view of the above-described circumstances, and has as its object the provision of the wafer suction pad that can appropriately hold wafers of different sizes.

In order to achieve the above-described objects, the present invention is directed to a wafer suction pad which is provided to a transporting arm of a transporting device and holds a wafer by suction, the wafer suction pad comprising: a pad body having a sucking face, the wafer being held on the sucking face, a plurality of annular grooves being concentrically formed on the sucking face; a plurality of air intake lines, each of the plurality of the air intake lines communicating with a corresponding one of the plurality of the annular grooves on the sucking face of the pad body; an air suction device which sucks air; a plurality of valves, each of the plurality of the air intake lines connecting with the air suction device via a corresponding one of the plurality of the valves; and a changing device which changes opening and closing of each of the plurality of the valves in accordance with an outer diameter of the held wafer.

According to the present invention, the annular grooves are concentrically arranged on the wafer sucking face of the wafer suction pad, so that air is sucked selectively in accordance with the outer diameter of the wafer to be held. Thus, by changing the suction area of the air every time the size of the wafer changes, wafers of various sizes can be appropriately held by suction by the wafer suction pad.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

Hereunder a preferred embodiment of the wafer suction pad of the present invention will be described with accompanying drawings. In the embodiment, the present invention is applied to a planarization apparatus, and the description will firstly be given to the construction of the planarization apparatus.

Figure 1:
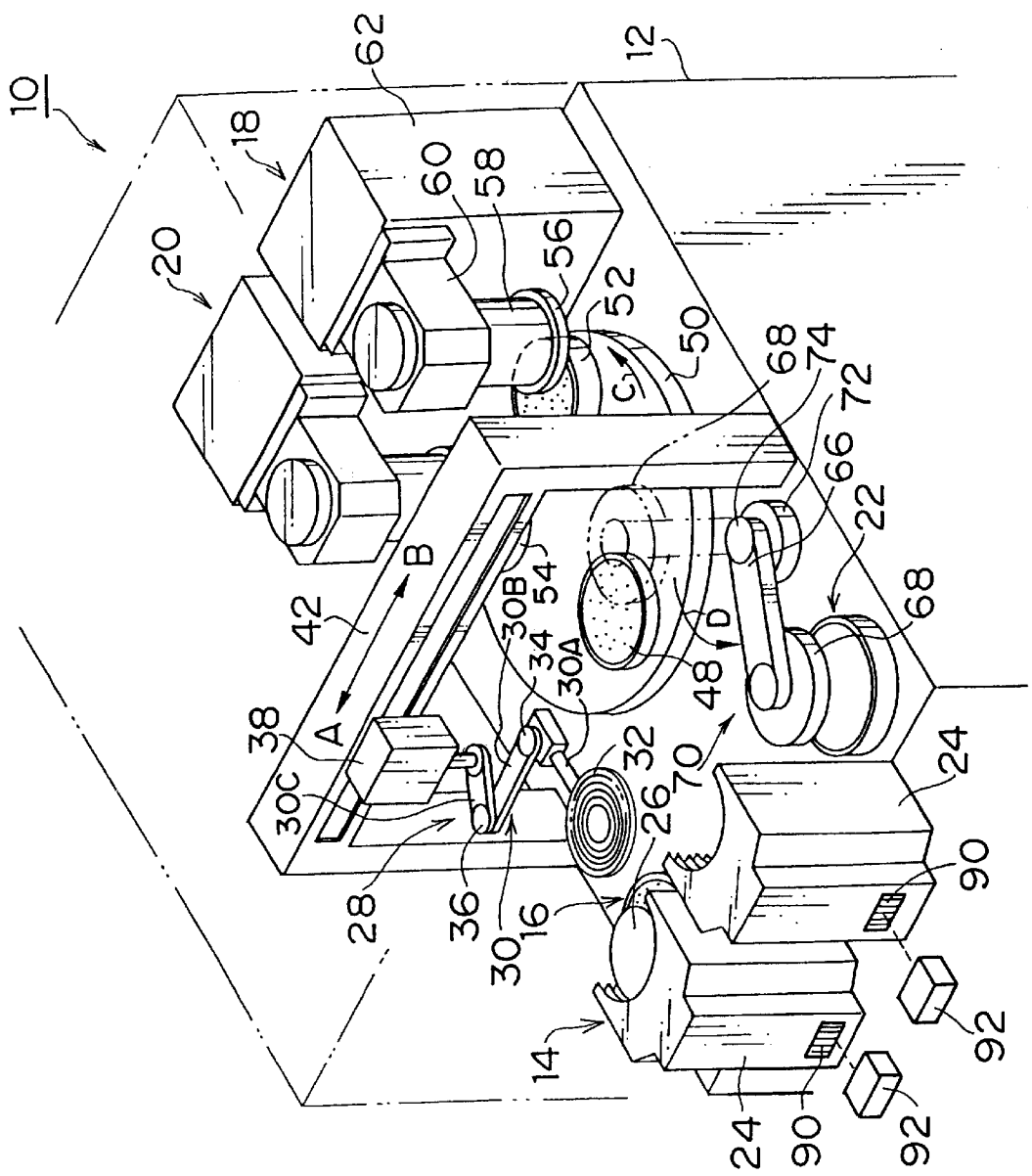
FIG. 1 is a perspective view of a planarization apparatus to which an embodiment of the present invention is applied.

FIG. 1 is a perspective view of the planarization apparatus. As shown in FIG. 1, a body 12 of a planarization apparatus 10 is provided with a cassette housing stage 14, an alignment stage 16, a rough grinding stage 18, a fine grinding stage 20, and a cleaning stage 22.

Two cassettes 24 and 24 are housed in the cassette housing stage 14. The cassettes 24 and 24 contain a number of unprocessed wafers 26. The wafers 26 housed in the cassettes 24 and 24 are picked up one by one from the cassette 24 and transported to the alignment stage 16 by a wafer transport robot 28.

The wafer transport robot 28 for transporting the wafers 26 is a common industrial robot, which has a multi-joints arm 30. The multi-joints arm 30 comprises three arms 30A, 30B, and 30C. The tip of the first arm 30A is provided with a wafer suction pad 32 for holding the wafer 26 by suction. The first arm 30A is provided to the tip of the second arm 30B, and is rotatable around its own axis and capable of swiveling around an axis 34. The second arm 30B is provided to the tip of the third arm 30C, and is capable of swiveling around an axis 36. The third arm 30C is provided to an elevating rod 40 of an elevator 38, and is capable of swiveling around the elevating rod 40 while moving vertically by extension and constriction of the elevating rod 40. The elevator 38 is provided to a beam 42, which is provided to the body 12, and is movable along the beam 42. By the wafer transport robot 28, the wafer 26 housed in the cassette 24 is held with the wafer suction pad 32 by suction and picked up, and is transported to the alignment stage 16 by individually controlling motions of the elements of the multi-joints arm 30 and the extension and constriction of the elevating rod 40.

The alignment stage 16 is a stage for aligning the wafer 26 transported from the cassette 24 at a predetermined position. The wafer 26, aligned by the alignment stage 16, is held by suction again with the wafer suction pad 32 of the wafer transport robot 28, and transported to an empty chuck table 48, then held by suction on the chuck table 48.

The chuck table 48 is placed on a turntable 50. The turn table 50 further comprises two chuck tables 52 and 54, which have the same functions as the chuck table 48, and the three chuck tables 48, 52 and 54 are arranged with a predetermined interval.

Figure 2:
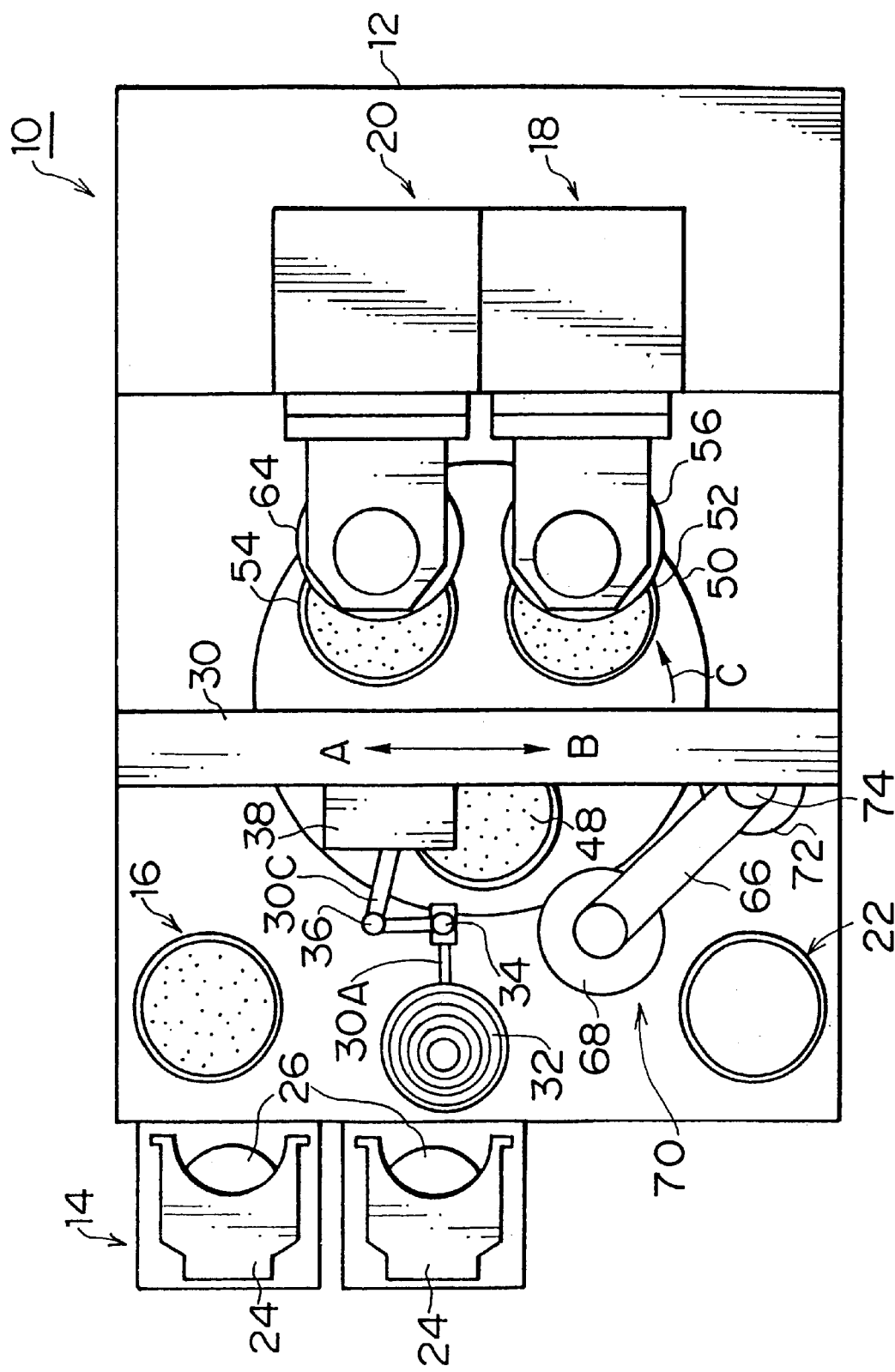
FIG. 2 is a plan view of the planarization apparatus in FIG. 1.

In FIGS. 1 and 2, the chuck table 52 is positioned at the rough grinding stage 18, where the wafer 26 is roughly ground. The chuck table 54 is positioned at the fine grinding stage 20, where the wafer 26 is finely ground (fine grinding and spark out).

The bottom of the chuck tables 48, 52 and 54 are connected with spindles of motors (not shown), by which the chuck tables 48, 52 and 54 are rotated.

The thickness of the wafer 26, which is held by suction on the chuck table 48, is measured by a measurement gage (not shown). The measured wafer 26 is moved to the rough grinding stage 18 by rotation of the turntable 50 in direction C in FIGS. 1 and 2. After that, the reverse of the wafer 26 is roughly ground by a cup-shaped grinding wheel 56 of the rough grinding stage 18.

The cup-shaped grinding wheel 56 is connected with a motor 58 as shown in FIG. 1, and the motor 58 is attached to a grinding wheel feeding machine 62 via a support casing 60. The grinding wheel feeding machine 62 moves the cup-shaped grinding wheel 56 up and down with the motor 58. The cup-shaped grinding wheel 56 is pressed against the reverse of the wafer 26 by the lowering movement by the grinding wheel feeding machine 62, so that the reverse of the wafer 26 is roughly ground.

A movement amount of the cup-shaped grinding wheel 56, that is, the ground amount of the wafer 26 by the cup-shaped grinding wheel 56, is set in accordance with a reference position of the cup-shaped grinding wheel 56, which is previously registered, and with the thickness of the wafer 26.

The thickness of the wafer 26 whose reverse is roughly ground at the rough grinding stage 18 is measured by the thickness measuring gage (not shown) after the cup-shaped grinding wheel 56 retreats from the wafer 26. The wafer 26 whose thickness is measured is moved to the fine grinding stage 20 by the rotation of the turntable 50 in direction C in FIGS. 1 and 2. After that, the wafer 26 is finely ground and sparked-out by a cup-shaped grinding wheel 64 of the fine grinding stage 20. A construction of the fine grinding stage 20 is substantially the same as the construction of the rough grinding stage 18, and the description thereon is then omitted.

The wafer 26 that is finely ground at the fine grinding stage 20 is transported to the position where the empty chuck table 48 is shown in FIG. 1 by the rotation of the turn table 50 in the direction of C in FIGS. 1 and 2 after the cup-shaped grinding wheel 64 retreats from the wafer 26. Then, the wafer 26 is transported to the cleaning stage 22 by a wafer transport robot 70.

The wafer transport robot 70 for transporting the wafer 26 is, as mentioned with respect to the wafer transport robot 28, a common industrial robot, and has an arm 66, of which tip is provided with a wafer suction pad 68. The arm 66 is provided to an elevating rod 74 of an elevator 72, and is capable of swiveling around the elevating rod 74 and further movable up and down by extension and constriction of the elevating rod 74. The wafer transport robot 70 controls the swiveling motion of the arm 66 and the extension and constriction motions of the elevating rod 74 whereby the wafer 26 can be transported from the position of the empty chuck table 48 to the cleaning stage 22.

The wafer 26 that is transported to the cleaning stage 22 is cleaned at the cleaning stage 22 and dried. Then, the wafer 26 is withdrawn from the cleaning stage 22 and housed in a certain shelf of the cassette 24 by the wafer transport robot 28.

The schematic construction of the planarization apparatus 10 is above described. In the planarization apparatus 10, the present invention is applied to the wafer suction pads 32 and 68 of the wafer transport robots 28 and 70. In other words, the wafer transport robots 28 and 70 are constructed in which the wafer suction pads 32 and 68 can hold by suction the wafers 26 of various sizes (outer diameters).

Hereunder construction of the wafer suction pads 32 and 68 is described. The wafer suction pad 32 of the wafer transport robot 28 and the wafer suction pad 68 of the wafer transport robot 70 have the same construction, and the construction of the wafer suction pad 68 of the wafer transport robot 70 is then described.

Figure 3:
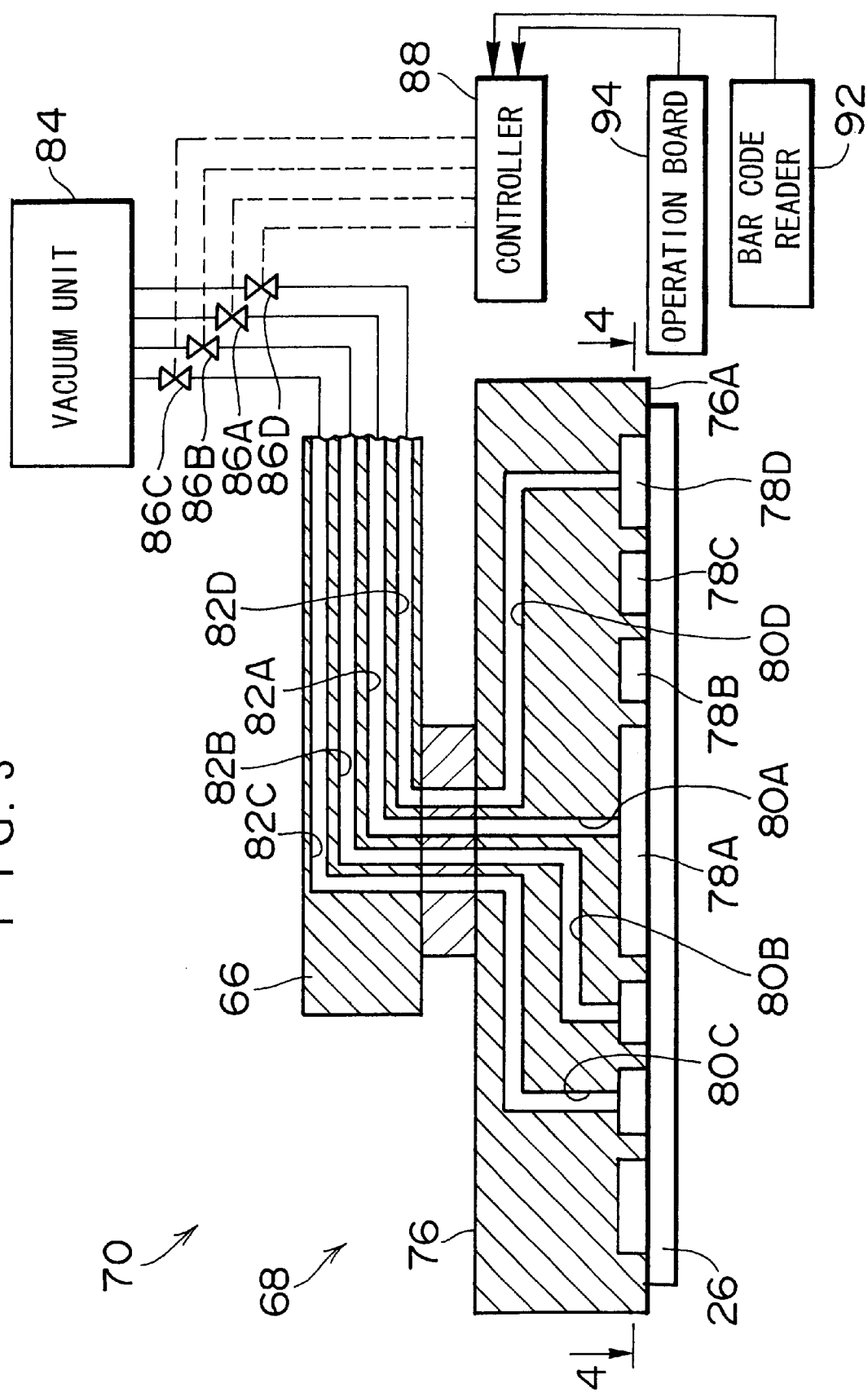
FIG. 3 is a front section view showing a construction of a wafer suction pad according to the embodiment of the present invention.
Figure 4:
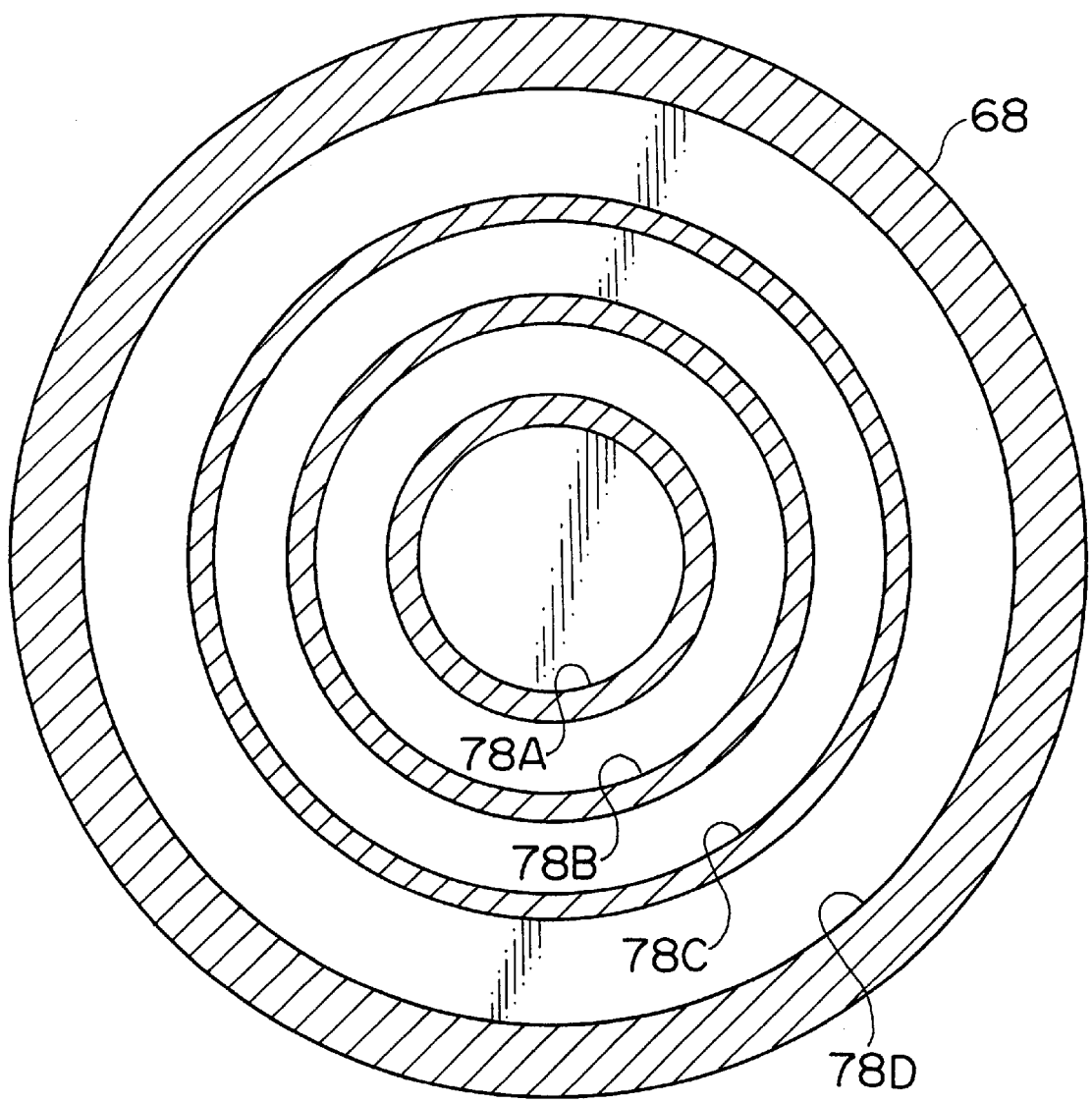
FIG. 4 is a section view of the wafer suction pad along line 4—4 in FIG. 3.

FIG. 3 is a front section view showing the construction of the wafer suction pad 68, and FIG. 4 is a section view along line 4—4 in FIG. 3.

As shown in FIGS. 3 and 4, a pad body 76 of the wafer suction pad 68 is formed like a disk. At the center of the bottom face of the pad body 76, that is, at the suction face 76A, on which the wafer 26 is held, a round recess 78A is formed. Three annular grooves 78B, 78C and 78D are formed on the suction face 76A concentrically with the round recess 78A.

The round recess 78A (hereunder referred to as "first groove"), which is formed at the center, has an outer diameter that is slightly smaller than an outer diameter of a 4-inches wafer, so that the entire face of the 4-inches wafer can be held by suction.

The annular groove 78B (hereunder referred to as "second groove"), which is formed outside the first groove 78A, has an outer diameter that is slightly smaller than an outer diameter of a 5-inches wafer; so that, together with the first groove 78A, the entire face of the 5-inches wafer can be held by suction.

The annular groove 78C (hereunder referred to as "third groove"), which is formed outside the second groove 78B, has an outer diameter that is slightly smaller than an outer diameter of a 6-inches wafer; so that, together with the first and second grooves 78A and 78B, the entire face of the 6-inches wafer can be held by suction.

The annular groove 78D (hereunder referred to as "fourth groove"), which is formed outside the third groove 78C has an outer diameter that is slightly smaller than an outer diameter of an 8-inches wafer; so that, together with the first, second and third grooves 78A, 78B and 78C, the entire face of the 8-inches wafer can be held by suction.

Four independent air intake lines 80A, 80B, 80C and 80D are formed inside of the pad body 76 so that they connect with the first, second, third and fourth grooves 78A, 78B, 78C and 78D, respectively. The four air intake lines 80A, 80B, 80C and 80D respectively connect with air intake lines 82A, 82B, 82C and 82D, which are independently formed inside the arm 66.

The four air intake lines 82A, 82B, 82C and 82D connect with a vacuum unit 84 via a first valve 86A, a second valve 86B, a third valve 86C and a fourth valve 86D, respectively. Each of the valves 86A, 86B, 86C and 86D is provided with a switch (not shown) to change opening/closing of the valve under control of a controller 88. The controller 88 controls opening/closing of the valves 86A–86D in accordance with the operation data from the outside. By controlling opening/closing of each of the valves 86A–86D with the controller 88, at least one of the grooves 78A–78D for sucking the air can be selected.

More specifically, if only the first valve 86A is opened, the air is sucked only from the round first groove 78A, which is formed at the center. If only the first valve 86A and the second valve 86B are opened, the air is sucked only from the first groove 78A and the second groove 78B. Thus, the wafers 26 of various sizes can be appropriately held by suction.

Description will be given on operation of the wafer suction pad in the present embodiment constructed as described above.

When an operator inputs, through an operation board 94 (refer to FIG. 3) of the planarization apparatus, a size of the wafer 26 that is housed in the cassette 24 that is set in the cassette housing stage 14, the size data is outputted to the controller 88. The controller 88 controls opening/closing of the valves 86A–86D in accordance with the size data of the wafer 26.

More specifically, if the size of the wafer 26 that is housed in the cassette 24 is 4 inches, the controller 88 opens the first valve 86 only and closes the other valves 86B–86D; whereby the air is sucked only from the central first groove 78A. Thus, when the 4-inches wafer 26 is held by suction at this state, the entire face of the wafer 26 of 4-inches size can be appropriately held by suction.

If the size of the wafer 26 that is housed in the cassette 24 is 6 inches, the controller 88 opens the first valve 86A, the second valve 86B and the third valve 86D and closes the fourth valve 86D; whereby the air is sucked only from the first groove 78A, the second groove 78B and the third groove 78C. Thus, when the 6-inches wafer 26 is held by suction at this state, the entire face of the wafer 26 of 6-inches size can be appropriately held by suction.

As described above, according to the wafer suction pad of the present embodiment, by extending or reducing the sucking area of the air on the wafer suction pad in accordance with the sizes of the wafer 26, the entire face of each of the wafers of various sizes can be held by suction. Thus, the suction pad does not have to be changed when the sizes of the wafer are different, and hence, the planarization apparatus can be operated efficiently. Moreover, since the entire face of the wafer 26 is held, the wafer 26 does not generate cracks or chips even if the extremely thin wafer 26 is held by suction.

In the wafer suction pads 32 and 68 in the present embodiment, three annular grooves 78B–78D are formed on the wafer sucking face 76A; however, the number of grooves is not limited, it may be increased. As the number of grooves is increased, the wafer suction pad can appropriately hold wafers in more variety of sizes.

The wafer suction pads 32 and 68 of the present embodiment have the annular grooves for holding the disk-shaped wafer; however, the present invention is not restricted to this. For example, on a wafer suction pad for holding a square wafer, grooves in the corresponding square shape are formed.

The grooves 78A–78D, which are formed on the wafer sucking face 76A, may be filled with a member such as a porous ceramics and the like that has air permeability so that the wafer sucking face 76A with the grooves can be flat.

The switches (not shown) of the valves 86A–86D for the wafer suction pads 32 and 68 of the present embodiment are controlled by the controller 88; however the operator may manually change the switches.

In the present embodiment, the air is sucked from all the groove or grooves located inside the outer periphery of the held wafer in order to hold by suction the entire face of the wafer; however, the present invention is not restricted to this. The air may be sucked only from the most outer groove inside the outer periphery of the held wafer, or only from the central groove, depending on demands.

For the wafer suction pads 32 and 68 of the present embodiment, the controller 88 controls opening/closing of the valves 86A–86D in accordance with the size data of the wafer 26 that is inputted by the operator; however the opening/closing control of the valves 86A–86D can be automated by a system described below.

As shown in FIG. 1, a bar code 90 in which various types of data such as the size of the housed wafers 26 are written is attached on the cassette 24 for housing the wafers which is commonly used for a planarization apparatus and so forth. Hence, a bar code reader 92 for reading the bar code 90 attached on the cassette 24 is provided to the cassette housing stage 14 so that the bar code reader 92 automatically reads the bar code 90 on the cassette 24 when the cassette 24 is set at the cassette housing stage 14. The controller 88 then controls opening/closing of the valves 86A–86D in accordance with the size data of the wafer read by the bar code reader 92. Thereby, opening/closing of the valves 86A–86D can be automatically controlled without the operator.

As to other alternatives, a sensor (e.g., a photo sensor) for determining the size of the wafer 26 housed in the cassette 24 may be provided to the cassette housing stage 14. When the cassette 24 is set at the cassette housing stage 14, the sensor automatically determines the size of the wafer 26 contained in the cassette 24, so that the opening/closing of the valves 86A–86D is controlled in accordance with the determined size data of the wafer 26. This embodiment also provides automatic control of opening/closing of the valves 86A–86D without the operator.

In the above-described embodiments, the present invention is applied to the planarization apparatus 10. However, the present invention can be applied to other various apparatuses as a holding device to hold and transport the wafers. The wafer suction pad of the present invention is especially useful for the apparatus that handles extremely thin wafers.

As described above, according to the wafer suction pad of the present invention, the sucking area of the air is changeable in accordance with the outer diameter of the wafer; therefore, the entire face of each of wafers of various sizes can be appropriately held by suction.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer suction pad which is provided to a transporting arm of a transporting device and holds a wafer by suction, the wafer suction pad comprising:

a pad body having a sucking face, the wafer being held on the sucking face, a plurality of annular grooves being concentrically formed on the sucking face;

a plurality of air intake lines, each of the plurality of the air intake lines communicating with a corresponding one of the plurality of the annular grooves on the sucking face of the pad body;

an air suction device which sucks air;

a plurality of valves, each of the plurality of the air intake lines connecting with the air suction device via a corresponding one of the plurality of the valves;

a changing device which changes opening and closing of each of the plurality of the valves in accordance with an outer diameter of the held wafer; and a controlling device which controls the changing device in accordance with the outer diameter of the held wafer.

2. The wafer suction pad as defined in claim 1, wherein said controlling device controls the changing device in accordance with externally inputted data of the outer diameter of the held wafer.

3. The wafer suction pad as defined in claim 2, further comprising a sensor which directly determines the outer diameter of the held wafer to input the data of the outer diameter of the held wafer to the controlling device.

4. The wafer suction pad as defined in claim 2, further comprising a sensor which indirectly determines the outer diameter of the held wafer to input the data of the outer diameter of the held wafer to the controlling device.

5. The wafer suction pad as defined in claim 1, further comprising a detection means for determining the outer diameter of the held wafer by one of direct sensing thereof and scanning of a data carrier carried in association with the wafer; and wherein said controlling device automatically controls the changing device in accordance with the outer diameter of the held wafer as determined by said detection means.

6. The wafer suction pad as defined in claim 5, wherein said detection means is a bar code reader.

7. The wafer suction pad as defined in claim 5, wherein said detection means is a photosensor for direct sensing the diameter of the wafer.

* * * * *